United States Patent [19]

Shirato

[11] Patent Number: 4,933,730

[45] Date of Patent: Jun. 12, 1990

[54] SEMICONDUCTOR DEVICE HAVING A HIGH BREAKDOWN VOLTAGE CHARACTERISTIC

[75] Inventor: Takehide Shirato, Hiratsuka, Japan

[73] Assignee: Fujitsu Limited, Kanagawa, Japan

[21] Appl. No.: 342,619

[22] Filed: Apr. 24, 1989

Related U.S. Application Data

[63] Continuation of Ser. No. 52,342, May 21, 1987, abandoned.

[30] Foreign Application Priority Data

May 23, 1986 [JP]  Japan .................................. 61-118506

[51] Int. Cl.$^5$ ............................................. H01L 29/78
[52] U.S. Cl. ................................... 357/23.4; 357/23.8; 357/23.12; 357/41; 357/90
[58] Field of Search ................... 357/23.4, 23.8, 23.1, 357/41, 90, 23.12

[56] References Cited

U.S. PATENT DOCUMENTS

| | | | |
|---|---|---|---|
| 4,119,996 | 10/1978 | Jhabvala | 357/23.4 X |
| 4,172,260 | 10/1979 | Okabe et al. | 357/23.4 |
| 4,173,818 | 11/1979 | Bassous et al. | 357/23.12 X |
| 4,280,855 | 7/1981 | Bertin et al. | 357/91 |
| 4,290,077 | 9/1981 | Ronen | 357/23.4 |
| 4,656,492 | 4/1987 | Sunami | 357/23.8 |

FOREIGN PATENT DOCUMENTS

| | | | |
|---|---|---|---|
| 60117674 | of 0000 | Japan . | |
| 125779 | 2/1978 | Japan | 357/23.4 |
| 54-137985 | 10/1979 | Japan | 357/23.4 |
| 66781 | 6/1981 | Japan | 357/23.4 |
| 93371 | 7/1981 | Japan | 357/23.4 |
| 1224335 | 3/1971 | United Kingdom | 357/23.4 |

OTHER PUBLICATIONS

Ohkura et al., "A Multilever Metallized DSA MOS Masterslice", *IEEE Journal of Solid-State Circuits*, vol. SC-14, No. 4, Aug., 1979, pp. 764-766.

Ohkura et al., "Fully Ion Implanted DSA MOS IC", *Jap. Jour. of Appl. Physics*, vol. 16 (1977), Supp. 16-1, pp. 167-171.

IEEE International Electron Devices Meeting, "Parasitic Effect-Free, High Voltage MOS ICS with Shield Source Structure", pp. 254-257, by H. Sakuma, T. Suzuki and M. Saito.

*Primary Examiner*—William Mintel
*Attorney, Agent, or Firm*—Armstrong, Nikaido, Marmelstein, Kubovcik & Murray

[57] ABSTRACT

A metal insulator semiconductor device having a high breakdown voltage characteristic and a fabricating method thereof. The device comprises a depletion region and an enhancement region formed in a semiconductor substrate under a gate electrode. The depletion region is formed adjacent to an offset region formed around a drain region. The enhancement type channel region is formed between the depletion region and a source region is as to have an extremely short channel length. The enhancement type channel region has a first type impurity concentration that is higher than that of the semiconductor substrate. The depletion region has a second type of impurity concentration that is opposite to the first type and lower than that of the offset region in order to increase the breakdown voltage at the drain region. The short channel length is formed by applying a diffusion self-aligning method.

3 Claims, 4 Drawing Sheets

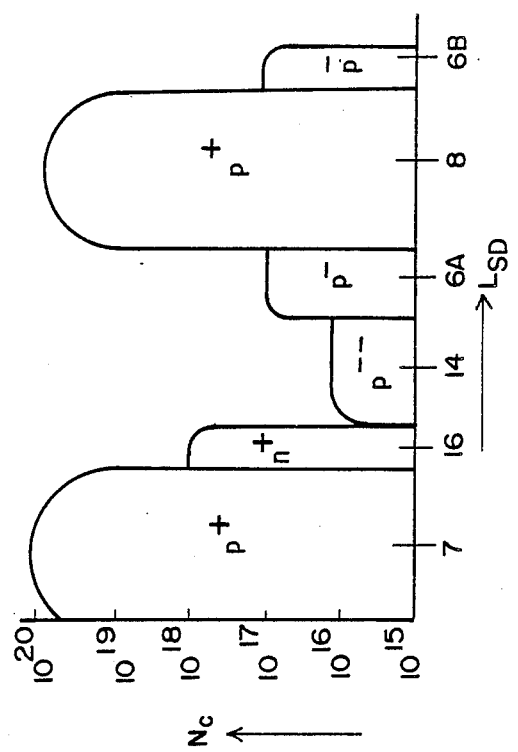
FIG. 3
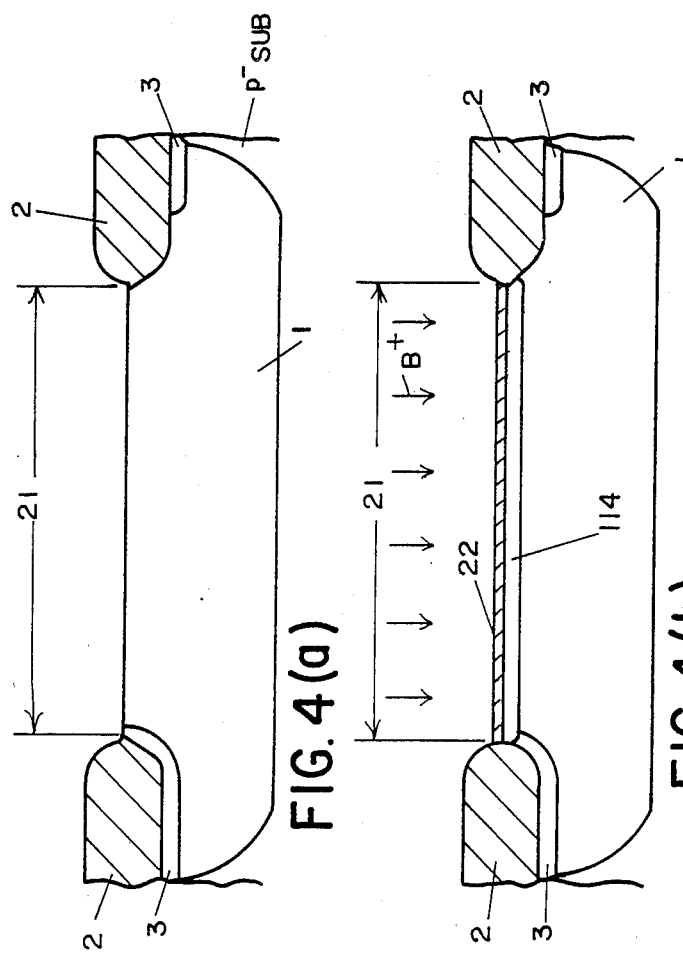
FIG. 4(a)
FIG. 4(b)

SEMICONDUCTOR DEVICE HAVING A HIGH BREAKDOWN VOLTAGE CHARACTERISTIC

This application is a continuation of application Ser. No. 052,342 filed May 21, 1987, now abandoned.

BACKGROUND OF THE INVENTION

The present invention relates to a semiconductor device having a high breakdown voltage characteristic and fabricating method thereof. In particular, a Metal Insulator Semiconductor (MIS) transistor has a structure having a high breakdown voltage characteristic without reducing the packing density of a semiconductor integrated circuit (IC) device. The MIS transistor also has an increasing amplication factor.

Recently, an IC device, having a control circuit for controlling a high voltage driving device such as a display device, is very widely used. In this IC device, certain characteristics relating to breakdown voltage, power drive ability, operation speed and amplification factor are required to be highly responsive to large scale integration, complex functions and high speeds of the high voltage driving device.

FIG. 1 is a schematic sectional side view for illustrating the structure of an enhancement type MIS transistor 101 which represents a typical prior art semiconductor device having a high breakdown voltage characteristic.

In FIG. 1, the MIS transistor 101 basically comprises a p+ type source region 7, a p+ type drain region 8 and a gate electrode 5. The source region 7 and the drain region 8 are formed on the surface of an n− type well 1. The gate electrode 5 is formed above the surface of the well 1 on a gate oxide layer 4. When a gate voltage is applied to the gate electrode 5, a channel region CH is formed under the gate electrode 5. Reference numeral 3 is an n-type channel stopper. A field oxide layer 2 is provided for separating a transistor region of the MIS transistor 101 from other electrical elements which are not shown in FIG. 1. An impurity block oxide layer 9 is formed on the source region 7, the drain region 8 and the gate electrode 5, and then an insulating film 10 is formed on the impurity block oxide layer 9 and the field oxide layer 2. The insulating film 10 is for insulating a source wiring 11, a gate wiring 12 and a drain wiring 13 respectively. The wirings 11, 12 and 13 are connected with the source region 7, the gate electrode 5 and the drain region 8 respectively, by removing part of the impurity block oxide layer 9 and the insulating film 10 which corresponds to each respective wiring. A p− type offset region 6 is located between the channel region CH and the drain region 8. The offset region 6 has a lower impurity concentration than the impurity concentration of the drain region 8 in order to have a high resistance. Due to the offset region 6, the depletion layer which is produced around the drain region 8 can be expanded. This results in the breakdown voltage being raised up to a high level at the drain region 8.

However, the prior art MIS transistor 101 has the following problems:

(1) The area occupied by the MIS transistor 101 tends to become enlarged because the offset length $L_{OF}$ of the offset region 6, which is located between the channel region CH and the drain region 8, must be lengthened in order to obtain a high breakdown voltage at the drain region 8.

(2) The operation speed and the amplification factor ($\beta$) of the MIS transistor 101 decrease because the offset length $L_{OF}$ is lengthened with increasing resistance thereof. The amplification factor $\beta$ is defined by the following formula:

$$\beta = W/L \cdot \mu \epsilon_{ox}/t_{ox}$$

where,
- $\beta$ is an amplifaction factor,
- W is a channel width,
- L is a channel length,
- $\mu$ is the mobility of carrier flowing through the channel,
- $\epsilon_{ox}$ is a dielectric contant of the channel, and
- $t_{ox}$ is the thickness of the gate oxide layer.

In the above formula, when the offset length $L_{OF}$ is lengthen, the mobility $\mu$ decreases, which results in a decrease in the amplification factor $\beta$.

(3) The width of the offset region 6 must be widened for driving the MIS transistor 101 at a high power because the conductance of the offset region 6 would decrease if only the length $L_{OF}$ were lengthened. This results in enlarging the area occupied by the MIS transistor 101.

(4) The channel length of the channel region CH is determined by the length of the gate electrode, so that the minimum channel length is limited by the minimum length of the gate electrode. The minimum length of the gate electrode is limited by the technical limitation of photo lithography. Therefore, the channel length has a limitation as long as the gate electrode is formed using photo lithography. In other words, high operation speed and high amplification factor $\beta$ are limited by the minimum length of the gate electrode as long as the gate electrode is formed by photo lithography.

(5) Generally, there are two types of MIS transistors: an enhancement type and a depletion type. An enchancement type MIS transistor is used for the amplifier as discussed above. Thus, the MIS transistor 101 is an enchancement type transistor and moreover it has a long channel length as stated above, so that the resistance of the MIS transistor 101 is high when the transistor is ON. Therefore, it is hard to obtain a high power operation and a high amplification factor $\beta$ of the MIS transistor 101.

SUMMARY OF THE INVENTION

One object of the present invention is to increase the breakdown voltage operating in a semiconductor device having a high breakdown voltage characteristic.

Another object of the present invention is to decrease the area occupied by the semiconductor device, even though the breakdown voltage increases.

Still another object of the present invention is to increase the operation speed of the semiconductor device.

A further object of the present invention is to increase the power of the semiconductor device.

An additional object of the present invention is to increase the amplification factor of the semiconductor device.

The above and other objects of the present invention are achieved by newly forming a depletion region and an enhancement type channel region in a surface of a semiconductor substrate of the semiconductor device (MIS transistor) under a gate electrode of the MIS transistor. The regions are formed between a drain region and a source region of the MIS transistor. The depletion region is defined hereinafter as a region having a low impurity concentration of impurities (a second type) which is reversed to a type (a first type) of impurities doped in the semiconductor substrate, when compared with the second type impurity concentration of the drain region. Note that the depletion region differs from a depletion layer. The depletion region which is is formed adjacent to an offset region formed around the drain region. The offset region has a lower impurity concentration than that of the drain region for increasing the breakdown voltage at the drain region as stated in the prior art explanation of FIG. 1. Since the depletion region is formed by doping the second of type impurities with a low impurity concentration, the resistance of the depletion region becomes extremely high when a gate voltage is not applied to the gate electrode. Therefore, an electrical potential at an end which is in contact with the enhancement channel region decreases. This results in the drain region having a higher breakdown voltage than that of the prior art. When the gate voltage is applied to the gate electrode, the resistance of the depletion region decreases. The resistance is equal to the ON resistance of the MIS transistor. The driving current of the MIS transistor and the amplification factor $\beta$ increase due to the resistance of the depletion region decreasing. The impurities doped in the depletion region are the same type as that in the offset region. However, the impurity concentration of the depletion region is lower than that of the offset region. Therefore, the resistance of the depletion region is higher than that of the offset region when the gate voltage is not applied to the gate electrode. Therefore, a depletion layer produced around the depletion region increases, which results in an increase in the breakdown voltage at the drain region. Due to the introduction of the depletion region, the high breakdown voltage characteristic of the MIS transistor can be obtained without enlarging the size of the MIS transistor.

An enchancement type channel region is formed between a source region and the depletion region. The source region is formed by doping a second impurity with the same impurity concentration as that of the drain region. The source region is aligned with the gate electrode, opposite the drain region with regard to the gate electrode. The enhancement type channel region is formed by doping first type impurities with a higher impurity concentration than that of the semiconductor substrate. The enhancement type channel region is formed having an extremely short channel length, so that a high operation speed of the MIS transistor can be obtained.

The extremely short channel length is formed by the following steps: first, the first type impurities are doped into a region where the source region will be formed in a later step, by alignment with the gate electrode; second, the doped first type impurities are laterally diffused, until the first type impurity region arrives under the gate electrode, by applying, for example, a drive-in heat treatment; third, the second type impurities are doped into the first type impurity region, by alignment with the gate electrode; and fourth the doped second type impurities are laterally doped for forming the source region. As a result of the above steps, which are called diffusion self-aligning (DSA), the first impurity type region of an extremely short length is produced. The short length becomes the enhancement type channel region. That is, an extremely short part, which is left after laterally diffusing the second type impurities of the first type impurity region, becomes the extremely short channel length of the enhancement type channel region. By applying the DSA method, the enhancement type channel region having the extremely short channel length can be easily and precisely formed, at a low cost, and with excellent reproducibility.

BRIEF DESCRIPTION OF THE DRAWINGS

FIG. 3 is an impurity concentration profile of regions located from a source region to a drain region of the semiconductor device embodying the present invention;

FIGS. 4(a), 4(b), 4(c), 4(d), 4(e) and 4(f) are schematic sectional side views illustrating the fabricating steps of the semiconductor device embodying the present invention.

DESCRIPTION OF THE PREFERRED EMBODIMENT

Figure 2:
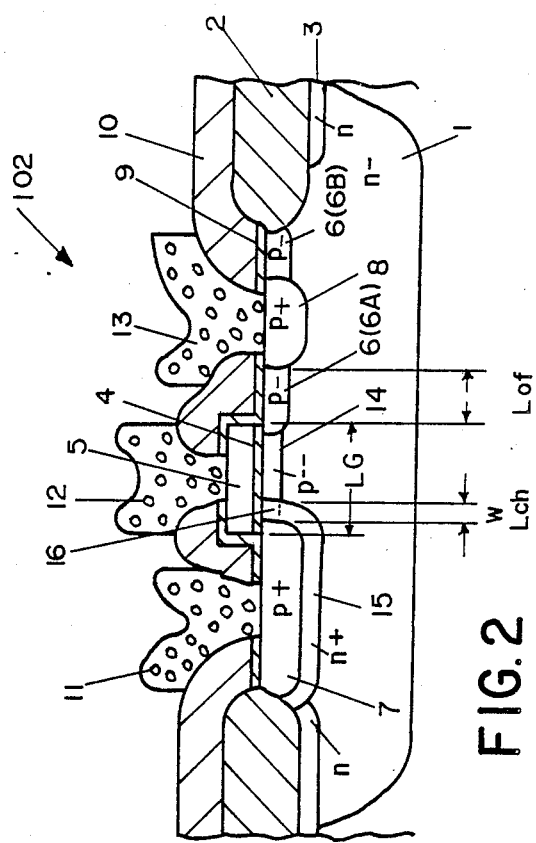
FIG. 2 is a schematic sectional side view of a semiconductor device having a high breakdown voltage characteristic and embodying the present invention.
Figure 4E:
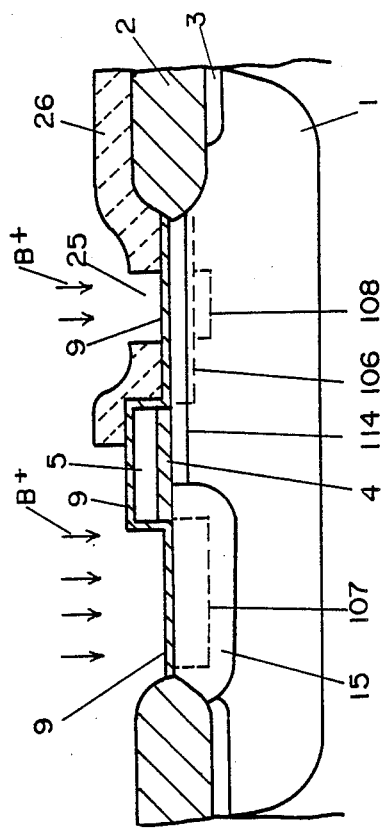
Figure 4F:
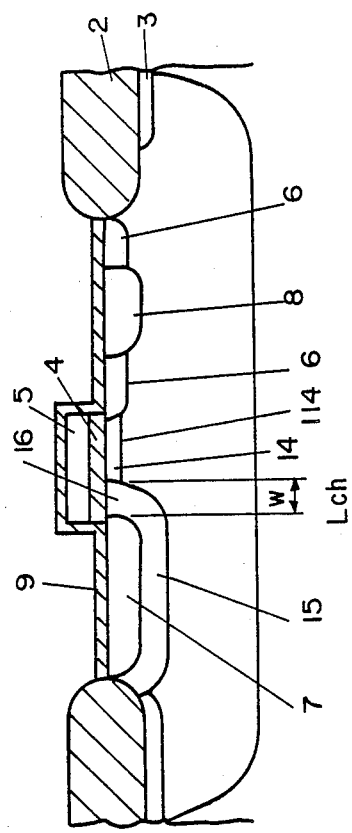

FIG. 2 illustrates a schematic sectional side view of a semiconductor device embodying the present invention having a high breakdown voltage characteristic. FIG. 3 shows an impurity concentration profile of regions located from a source region to a drain region of the semiconductor device. FIGS. 4(a)-4(f) show the schematic sectional side views illustrating the fabricating steps of the semiconductor device. FIG. 5 illustrates a schematic sectional side view of another structure of the semiconductor device. In FIGS. 2-5, the same reference numerals and symbols have the same function respectively.

Figure 1:
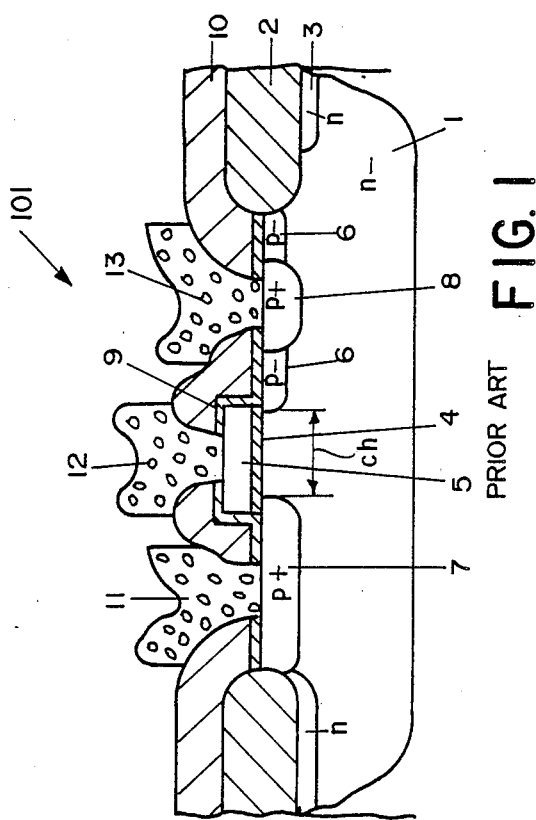
FIG. 1 is a schematic sectional side view of the prior art MIS transistor having a high breakdown voltage characteristic.

In FIG. 2, a MIS transistor 102 embodying the present invention is illustrated as a semiconductor device having a high breakdown voltage characteristic The MIS transistor 102 basically comprises a p+ type source region 7 having an impurity concentration of $10^{20}$ cm$^{-3}$, a p+ type drain region 8 having the same impurity concentration as that of the source region 7, and a gate electrode 5 comprising, for example, polycrystalline silicon having a gate length $L_G$ of, for example, 5 $\mu$m. The source region 7 and the drain region 8 are formed in the surface part of an n− type well 1, and the gate electrode 5 is formed above the surface of the well 1 on a gate oxide layer 4. Reference numeral 3 is an n type channel stopper. Particularly, the channel stopper 3, at the side of the drain region 8, is separately formed from the drain region 8 to prevent the breakdown voltage from falling at the drain region 8. A field oxide layer 2 is provided for separating the transistor region for the MIS transistor 102 from other electrical elements which are not shown in FIG. 2. An impurity block oxide layer 9 is formed on the source region 7, the drain region 8 and the gate electrode 5. The insulating film 10 comprises phosphoric silicon glass (PSG) and is formed on the impurity block oxide layer 9 and the field oxide layer 2 for insulating a source wiring 11, a gate wiring 12 and a drain wiring 13 from each other. The wirings 11, 12 and 13 comprise aluminum (Al) and are connected with the source region 7, the gate electrode 5 and the drain region 8 respectively. Reference numeral 6 located around the drain region 8 is a p⁻ type offset region having an impurity concentration of $10^{17}$ cm$^{-3}$ for obtaining high resistance. The offset region 6 is provided for expanding a depletion layer for the drain region 8, which results in the breakdown voltage being raised at the drain region 8. The offset region 6 is divided into 6A and 6B. The offset region 6A is a region located between a p⁻⁻ type deletion region 14, which will be explained later, and the drain region 8, and the offset region 6B is a region located between the drain region 8 and the field oxide layer 2 located at the side of the drain region 8. Particularly, a length $L_{OF}$ of the offset region 6A is quite effective for obtaining the high breakdown voltage at the drain region 8 as mentioned in the prior art explanation with FIG. 1. The length $L_{OF}$ is approximately 3 μm in this embodiment.

In the embodiment of the present invention, the structure mentioned above is similar to the prior art explained before in FIG. 1. However the following structure of regions of reference numerals 14, 15 and 16 differs from the prior art. That is, in the prior art, there was no particular region in which impurities were doped in the surface part of the well 1 under the gate electrode 5. Rather, FIG. 1 only shows the channel region CH was produced when a proper gate voltage was applied to the gate electrode 5. However, in the embodiment of the present invention, regions 14 and 16, in which different type impurities are doped respectively, are formed in place of the channel forming region CH of the prior art. The region 14 is a p⁻⁻ type depletion region having an impurity concentration of $10^{16}$ cm$^{-3}$, the region 16 is an enhancement type channel region having a very short channel length $L_{ch}$ such as 0.2-0.5 μm, and the region 15 is an n⁺ type region having an impurity concentration of $10^{17}$-$10^{19}$ cm$^{-3}$ region 15 is formed secondary for providing the region 16.

The n⁺ type region 15 is formed by (1) doping impurities into the surface part of the well 1, aligned with the side edges of the field oxide layer 2 and the gate electrode 5 at the place where the source region 7 will be formed, before forming the source region 7, and (2) laterally diffusing the doped impurities by carrying out a drive-in heat treatment so that a designated width w, which corresponds to the channel length $L_{ch}$, of the p⁻⁻ type depletion region 14 is inverted to the n⁺ type enhancement type channel region 16.

FIG. 3 is an impurity concentration profile between source region 7 and the drain region 8 of the above described structure of the embodiment. In FIG. 3, reference symbol $N_C$ indicated the impurity concentration and $L_{SD}$ indicates a distance toward the drain region 8 from the source region 7. As shown in FIG. 3, in the embodiment, the impurities in the offset region 6 and the depletion region 14 are decreased in a direction from the drain region 8 to the enhancement type channel region 16, which results in a higher breakdown voltage at the drain region 8 when the gate voltage is not applied to the gate electrode 5, as previously explained. Therefore, there is no need to enlarge the offset region. In other words, there is no need to enlarge the size of the MIS transistor in order to increase the breakdown voltage characteristic. When the gate voltage is applied to the gate electrode 5, the power ability and the amplification factor β of the MIS transistor increase as explained before. This is due to the resistance of the depletion region 14 decreasing because of the doped p⁻⁻ type impurities and due to the channel length $L_{ch}$ being extremely short.

The embodiment of the present invention will be further detailed by disclosing a fabricating method of a metal oxide semiconductor (MOS) transistor, as follows referring to FIGS. 4(a) through 4(f).

(1) In FIG. 4(a), a p⁻ type silicon substrate, indicated by symbol p⁻ SUB has a resistivity of several tens of ohm-cm. N-type impurities are selectivly doped in the surface part of the p⁻ SUB. In the surface part of the p⁻ SUB, an n⁻ type well 1 having an impurity concentration of $10^{15}$ cm$^{-3}$ is formed. A field oxide layer 2 for defining a transistor element forming region 21 is formed by applying a selective oxidation technique. An n type channel stopper 3 is formed beneath the field oxide layer 2 by applying the usual ion implantation technique. As explained before, a channel stopper 3 at the side of the drain region 8 is separated from an edge of the transistor element forming region 21 to avoid lowering the breakdown voltage at the drain region 8.

(2) In FIG. 4(b), after forming a protection layer 22 on the surface of the well 1 over the region 21, a p⁻⁻ type inversion region 114 having an impurity concentration of $10^{16}$ cm$^{-3}$ is formed in the surface part of the well 1 beneath the protection layer 22. The protection layer 22 is formed by applying a heat oxidation method, providing anneal treatment, and by executing ion implantation of boron (B⁺) into the surface part of the well 1 beneath the protection layer 22 through the protection layer 22.

Figure 4C:
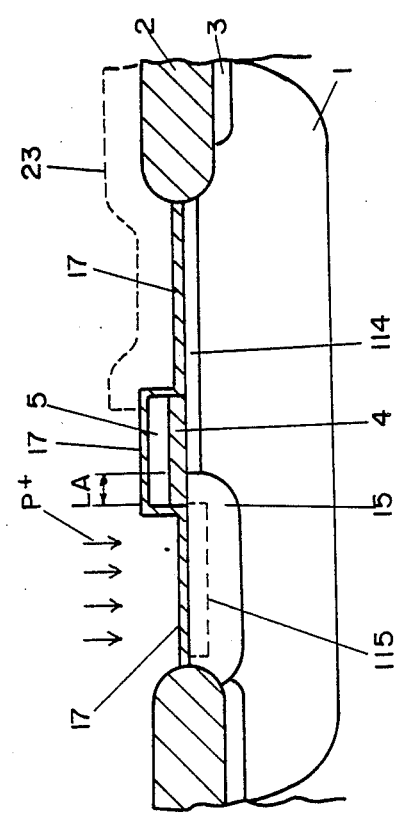
Figure 5:
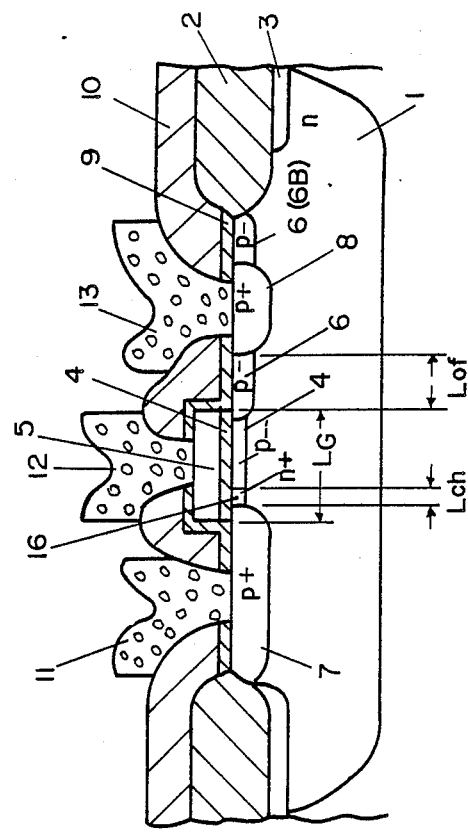
FIG. 5 is a schematic sectional side view of another structure of a semiconductor device having a high breakdown characteristic and embodying the present invention.

(3) In FIG. 4(c), after removing the protection layer 22, a gate oxide layer 4 is formed over the transistor element forming region 21. A polycrystalline silicon layer having electrical conductivity is formed thereto. Then a gate electrode composed of, for example, polycrystalline silicon is formed on the gate oxide layer 4 by applying a usual photo lithography. Next, after removing the gate oxide layer 4 by etching using the gate electrode 5 as a mask, a thin oxide film 7 is formed thereto. Next, after masking a drain forming region, which is a region for forming a drain region, with a first resist mask 23, ion implantation is carried out into the source forming region using a proper dose of, for example, phosphorous (P⁺) as a donor, by aligning with the gate electrode 5 (reference numeral 115 is a P⁺ implantation region). Then, after removing the first resist mask 23, an n⁺ type region 15 having an impurity concentration of $10^{18}$ cm$^{-3}$ is formed at a depth of 8,000 Å by inverting a p⁻⁻ type region 114 by a drive-in heat treatment. Namely, the phosphorous also diffuses in a lateral direction, so that the n⁺ type region 15 is formed beneath the gate electrode having a length of approximate 8,000 Å as shown by reference symbol $L_A$ in FIG. 4(c). The impurity concentration of the region 15 can be adjusted to a proper threshold voltage ($V_{th}$) of the MOS transisotr.

Figure 4D:
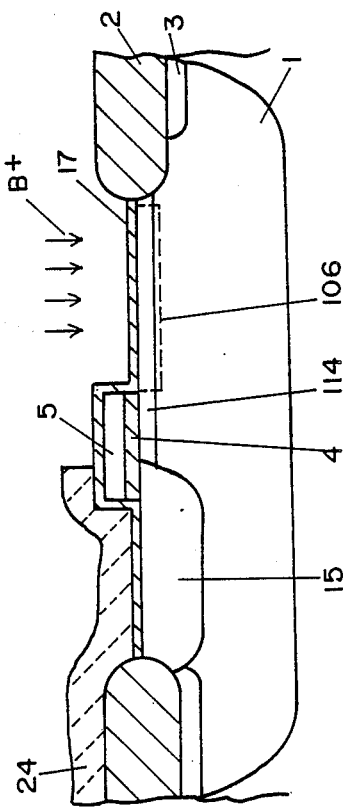

(4) In FIG. 4(d), after masking a source forming region using a resist mask 24, ion implantation is carried out by implanting a proper low dose of B⁺ over the drain side of the transistor element forming region 21, by aligning with the gate electrode 5. Reference numeral 106 is a low B⁺ implantation region.

(5) In FIG. 4(e), after removing the second resist mask 24 and removing the thin oxide film 17 by etching, an impurity block oxide layer 9 is formed on the silicon surface by a heat oxidation method. Then, after forming a third resist mask 26 having an aperture 25 for exposing the drain forming region at the drain side of the transistor element forming region 21, ion implantation is carried out using a proper high dose of B+, by aligning with the gate electrode 5 and the aperture 25 of the third resist mask 26. Reference numeral 107 and 108 are a first high B+ implantation region and a second B+ implantation region respectively.

(6) In FIG. 4(f), after removing the third resist mask 26 and activating the low B+ implantation region 106, the first high B+ implantation region 107, and the second high B+ implantation region 108, the following steps are carried out: a p+ type source region 7 is formed in the n+ type region 15 with a depth of 6,000 Å by inverting the region 15 so as to have an impurity concentratiom of approximate $10^{20}$ cm$^{-3}$ by aligning with the gate electrode 5; a p$^-$ type offset region 6 is formed at the drain side of the transistor element forming region 21 by aligning so that a source region side edge of the channel region is aligned with an edge of the gate electrode 5; and a p+ type drain region 8 is formed so as to have an impurity concentration of approximate $10^{20}$ cm$^{-3}$ at a depth of 6,000 Å by aligning to the aperture 25 of the third resist mask.

The n+ type region 15, which stays under the gate electrode 5, functions as an enhancement type channel region 16 having a channel length $L_{ch}$. That is, the channel length $L_{ch}$ is defined by the difference between the diffusion depth of the n+ type region 15 and the p+ type source region 7. Defining the enhancement type channel region 16 is carried out by applying the DSA method. The p$^{--}$ type inversion region 114 functions as the p$^{--}$ type depletion region 14.

(7) In FIG. 2, after the above steps from (1) to (6) are over, the following steps are carried out similarly to the prior art: an insulating film 10 comprising PSG is formed by a CVD method and wiring contact windows for exposing respective parts of the insulating film 10, the source region 7, the gate electrode 5 and the drain region 8 are formed. The wirings are made of, for example, Al. The wirings are formed on the insulating film 10 so that a source wiring 11, a gate wiring 12 and a drain wiring 13 are connected with the respective regions.

(8) Though there is no figure indicated, an insulating film for covering the transistor element fabricated is formed, then the fabrication of a MOS transistor having a high breakdown voltage characteristic is completed.

Thus arranging the depletion region and the enhancement type channel region under the gate electrode in a direction from the drain region to the source region, the MOS transistor of the embodiment actually can have the breakdown voltage as high as 100 volts.

In the above fabrication method, the enhancement type channel region 16 is formed by applying the DSA method. However, the channel region 16 can be fabricated by locally doping the first impurities, leaving the depletion region 14, as shown in FIG. 5. However, in this case, proper masks are required for the doping and it is hard to fabricate the extremely short channel length $L_{ch}$ with the well reproducibility by aligning the masks. The DSA method applied in the embodiment is better than the above usual doping method.

What is claimed is:

1. A metal insulator high speed semiconductor device having a high breakdown voltage characteristic comprising:

a semiconductor body of a first conductivity type having a first impurity concentration of first type impurities and having a first region;
 a gate electrode formed above said first region;
 a source region, formed in said semiconductor body adjacent to said first region, said source region being a second conductivity type opposite to said first conductivity type and having a second impurity concentration of second type impurities opposite to said first type impurities;
 a drain region, formed in said semiconductor body, of said second conductivity type having said second impurity concentration of said second type impurities, said drain region being formed on the opposite side of said gate electrode opposed to said source region so that a side edge of said drain region, which faces toward said source region, is positioned having a first space to said first region;
 an offset region formed in said first space and on opposing sides of said drain region to surround said drain region, said first offset region being said second conductivity type having a third impurity concentration of said second type impurities and said third impurity concentration being lower than said second impurity concentration to substantially increase a drain region breakdown voltage;
 at least one depletion region formed in said first region adjacent to said offset region, said depletion region having a depth in said semiconductor body which is less than said source and drain regions, said depletion region being said second conductivity type having a fourth impurity concentration of said second type impurities, said fourth impurity concentration being lower than said third impurity concentration, and a side edge of said depletion region, which faces toward said source region, being positioned to leave a second space adjacent to said source region; and
 an enhancement type channel region formed in said second space in said first region, said enhancement type channel region being said first conductivity type having a fifth impurity concentration of said first type impurities, and said fifth impurity concentration being higher than said first impurity concentration, said enhancement type channel region being formed by doping said second space with said second type impurities of said fourth impurity concentration which are compensated by said first type of impurities of said fifth impurity concentration wherein said enhancement type channel region at said second space provides an enhancement characteristic.

2. A metal insulator semiconductor device according to claim 1, wherein said first impurity concentration is of order $10^{15}$ cm$^{-3}$, said second impurity concentration is of order $10^{20}$ cm$^{-3}$, said third impurity concentration is of order $10^{17}$ cm$^{-3}$, said fourth impurity concentration is of order $10^{16}$ cm$-3$, and said fifth impurity concentration is of order $10^{18}$ cm$^{31\ 3}$.

3. A metal insulator semiconductor device according to claim 1 or 2, wherein said second space has a length of 0.2–0.5 μm in a direction from said source region to said drain region.

* * * * *